United States Patent
Zhang et al.

(10) Patent No.: US 10,177,141 B2
(45) Date of Patent: Jan. 8, 2019

(54) PREPARATION METHOD FOR HETEROGENEOUS SIGE BASED PLASMA P-I-N DIODE STRING FOR SLEEVE ANTENNA

(71) Applicant: Xi'an Creation Keji Co., Ltd., Xi'an (CN)

(72) Inventors: Liang Zhang, Xi'an (CN); Yu Zuo, Xi'an (CN)

(73) Assignee: XI'AN CREATION KEJI CO., LTD., Xi'an (CN)

( * ) Notice: Subject to any disclaimer, the term of this patent is extended or adjusted under 35 U.S.C. 154(b) by 0 days.

(21) Appl. No.: 15/851,867

(22) Filed: Dec. 22, 2017

(65) Prior Publication Data
US 2018/0175028 A1 Jun. 21, 2018

Related U.S. Application Data

(63) Continuation of application No. PCT/CN2017/110919, filed on Nov. 14, 2017.

(30) Foreign Application Priority Data

Dec. 20, 2016 (CN) .......................... 2016 1 1184338

(51) Int. Cl.
*H01L 27/08* (2006.01)
*H01Q 7/00* (2006.01)
(Continued)

(52) U.S. Cl.
CPC ...... *H01L 27/0814* (2013.01); *H01L 21/0217* (2013.01); *H01L 21/0262* (2013.01); *H01L 21/02164* (2013.01); *H01L 21/02236* (2013.01); *H01L 21/02532* (2013.01); *H01L 21/02595* (2013.01); *H01L 21/26513* (2013.01); *H01L 21/3065* (2013.01); *H01L 21/30625* (2013.01);
(Continued)

(58) Field of Classification Search
CPC .. H01C 5/40; H01C 23/00; H01C 7/00; H01L 29/868
See application file for complete search history.

(56) References Cited

U.S. PATENT DOCUMENTS

| | | | |
|---|---|---|---|
| 2006/0194357 A1* | 8/2006 | Hsu ......................... | C30B 19/00 438/28 |
| 2008/0099881 A1* | 5/2008 | Jung ................... | H01L 27/0676 257/601 |
| 2009/0128428 A1* | 5/2009 | Ishizuka ................ | H01Q 1/243 343/702 |

* cited by examiner

*Primary Examiner* — Mohammed R Alam
(74) *Attorney, Agent, or Firm* — Hemisphere Law, PLLC; Zhigang Ma (57) ABSTRACT

A preparation method for a SiGe based plasma p-i-n diode string for a sleeve antenna is provided. The preparation method includes: selecting a SiGeOI substrate with a certain crystal orientation and forming isolation regions on the SiGeOI substrate; etching the substrate to form P-type trenches and N-type trenches, depths of the P-type trenches and the N-type trenches each being smaller than a thickness of a top SiGe layer of the substrate; filling the P-type trenches and the N-type trenches and forming P-type active regions and N-type active regions in the top SiGe layer of the substrate by an ion implantation process; and forming leads on the substrate so as to obtain the heterogeneous SiGe based plasma p-i-n diode. Therefore, a high-performance heterogeneous SiGe based plasma p-i-n diode suitable for forming a solid-state plasma antenna is prepared by using a deep trench isolation technology and the ion implantation process.

10 Claims, 10 Drawing Sheets (51) Int. Cl.
*H01L 21/822* (2006.01)
*H01L 21/762* (2006.01)
*H01L 21/265* (2006.01)
*H01L 21/3065* (2006.01)
*H01L 21/02* (2006.01)
*H01L 21/311* (2006.01)
*H01L 21/324* (2006.01)
*H01L 27/12* (2006.01)
*H01L 29/06* (2006.01)
*H01L 29/04* (2006.01)
*H01L 29/165* (2006.01)
*H01L 29/868* (2006.01)
*H01L 29/66* (2006.01)
*H01L 21/306* (2006.01)
*H01Q 23/00* (2006.01)
*H01L 21/84* (2006.01)
*H01Q 13/08* (2006.01)
*H01Q 5/328* (2015.01)

(52) U.S. Cl.
CPC ...... *H01L 21/31111* (2013.01); *H01L 21/324* (2013.01); *H01L 21/76283* (2013.01); *H01L 21/822* (2013.01); *H01L 21/84* (2013.01); *H01L 27/1203* (2013.01); *H01L 29/04* (2013.01); *H01L 29/0649* (2013.01); *H01L 29/165* (2013.01); *H01L 29/6609* (2013.01); *H01L 29/868* (2013.01); *H01Q 5/328* (2015.01); *H01Q 7/00* (2013.01); *H01Q 13/08* (2013.01); *H01Q 23/00* (2013.01)

PREPARATION METHOD FOR HETEROGENEOUS SIGE BASED PLASMA P-I-N DIODE STRING FOR SLEEVE ANTENNA

FIELD OF THE DISCLOSURE

The disclosure relates to the field of manufacturing technologies of semiconductor devices, and more particularly to a preparation method for a heterogeneous SiGe based plasma p-i-n diode string for a sleeve antenna.

BACKGROUND

At present, a reconfigurable antenna, especially a frequency reconfigurable antenna, can work under a plurality of frequencies, which is always one of important key points in the field of antenna research at domestic and foreign, and an applicable range of the antenna is greatly widened. A material adopted by a p-i-n diode applied to the plasma reconfigurable antenna at domestic and foreign is a bulk silicon material, such material has the problem of lower carrier mobility of an intrinsic region, which affects a carrier concentration of the intrinsic region of the p-i-n diode and further affects a concentration of solid-state plasma. Besides, a P region and an N region of such structure are formed by mostly adopting an implantation process, and the method requires relatively large implantation dosage and energy, has high requirements on equipment and is incompatible with the existing process. However, if a diffusion process is adopted, a junction depth is deeper, but the P region and N region have relatively larger areas, resulting in a low integration level and an uneven doping concentration, and thereby affecting electrical properties of the p-i-n diode and leading to poor controllability in concentration and distribution of the solid-state plasma.

Therefore, how to select a proper material and preparation process to produce the plasma p-i-n diode for applying to the solid-state plasma antenna becomes very important.

SUMMARY

Therefore, in order to solve the technical defects and deficiencies in the prior art, the disclosure provides a preparation method for a SiGe based plasma p-i-n diode string for a sleeve antenna.

In particular, an embodiment of the disclosure provides a preparation method for a SiGe based plasma p-i-n diode string for a sleeve antenna. The plasma p-i-n (also referred to as Positive-Intrinsic-Negative or P-type-Intrinsic-N-type) diode string is configured (i.e., structured and arranged) for manufacturing the sleeve antenna, the sleeve antenna includes a semiconductor substrate, a p-i-n diode antenna arm, a first p-i-n diode sleeve a second p-i-n diode sleeve, a coaxial feeder and DC bias wires. The preparation method includes steps of:

(a) selecting a SiGeOI substrate with a certain crystal orientation;

(b) forming a first protective layer on a surface of a top SiGe layer of the SiGeOI substrate;

(c) forming a first isolation region pattern on the first protective layer by a photolithography process;

(d) etching the first protective layer and the SiGeOI substrate in designated positions of the first isolation region pattern by a dry etching process to form isolation trenches, wherein depths of the isolation trenches each are larger than or equal to a thickness of the top SiGe layer of the SiGeOI substrate;

(e) filling the isolation trenches to form isolation regions of plasma p-i-n diodes;

(f) etching the SiGeOI substrate to form P-type trenches and N-type trenches, wherein depths of the P-type trenches and the N-type trenches each are smaller than the thickness of the top SiGe layer of the SiGeOI substrate;

(g) filling the P-type trenches and the N-type trenches, and forming P-type active regions and N-type active regions in the top SiGe layer of the SiGeOI substrate by an ion implantation process; and (h) forming leads on the SiGeOI substrate, so as to obtain the heterogeneous SiGe based plasma p-i-n diode string.

On the basis of the above embodiment, the first protective layer includes a first $SiO_2$ layer and a first SiN layer; and correspondingly the step (b) includes:

(b1) preparing a $SiO_2$ material on a surface of the top SiGe layer to form the first $SiO_2$ layer; and (b2) preparing a SiN material on, a surface of the first $SiO_2$ layer to form the first SiN layer.

On the basis of the above embodiment(s), the step (f) includes:

(f1) forming a second protective layer on a surface of the SiGeOI substrate;

(f2) forming a second isolation region pattern on the second protective layer by a photolithography process; and (f3) etching the second protective layer and the SiGeOI substrate in designated positions of the second isolation region pattern by a dry etching process to form the P-type trenches and the N-type trenches.

On the basis of the above embodiment(s), the second protective layer includes a second $SiO_2$ layer and a second SiN layer; and correspondingly the step (f1) includes:

(f11) preparing a $SiO_2$ material on the surface of the SiGeOI substrate to form the second $SiO_2$ layer; and (f12) preparing a SiN material on a surface of the second $SiO_2$ layer to form the second SiN layer.

On the basis of the above embodiment(s), the step (g) includes:

(g1) oxidizing the P-type trenches and the N-type trenches to form oxide layers on inner walls of the P-type trenches and the N-type trenches;

(g2) etching the oxide layers on the inner walls of the P-type trenches and the N-type trenches by a wet etching process to planarize the inner walls of the P-type trenches and the N-type trenches; and (g3) filling the P-type trenches and the N-type trenches.

On the basis of the above embodiment(s), the step (g3) includes.

(g31) filling the P-type trenches and the N-type trenches with a polysilicon;

(g32) Ruining a polysilicon layer on the SiGeOI substrate after planarizing the SiGeOI substrate;

(g33) patterning the polysilicon layer by photolithography, implanting a P-type impurity and an N-type impurity respectively in positions where the P-type trenches and the N-type trenches are located by an ion implantation process with a photoresist to form the P-type active regions and the N-type active regions and meanwhile form P-type contact regions and N-type contact regions;

(g34) removing the photoresist; and (g35) removing the polysilicon layer outside the P-type contact regions and the N-type contact regions by wet etching.

On the basis of the above embodiment(s), the step (h) includes:

(h1) preparing a $SiO_2$ material on the SiGeOI substrate;

(h2) activating impurities in the active regions by an annealing process;

(h3) forming lead holes by photolithography in the P-type contact regions and the N-type contact regions to for ii the leads;

(h4) performing a passivation treatment, forming pads by photolithography and performing an interconnection, so as to obtain the heterogeneous SiGe based plasma p-i-n diode string.

On the basis of the above embodiment(s), the p-i-n diode antenna arm, the first p-i-n diode sleeve, the second p-i-n diode sleeve and the direct bias wires are all formed on the semiconductor substrate; the p-i-n diode antenna arm, the first p-i-n diode sleeve and the second p-i-n diode sleeve are connected by the coaxial feeder, an inner core wire of the coaxial feeder is connected to the p-i-n diode antenna arm, and an outer conductor of the coaxial feeder is connected to the first p-i-n diode sleeve and the second p-i-n diode sleeve.

The p-i-n diode antenna arm includes serially connected p-i-n diode strings, the first p-i-n diode sleeve includes serially connected p-i-n diode strings, the second p-i-n diode sleeve includes serially connected p-i-n diode strings, and each the p-i-n diode string is connected to a DC bias through a corresponding one of the DC bias wires.

On the basis of the above embodiment(s), the p-i-n diode string includes p-i-n diodes, each of the p-i-n diodes includes a P+ region, an N+ region, an intrinsic region, a P+ contact region and an N+ contact region; the P+ contact regions are connected to the P+ regions and an positive electrode of a DC power supply, and the N+ contact regions are connected to the N+ regions and a negative electrode of the DC power supply.

On the basis of the above embodiment(s), doping concentrations of the P+ regions and the N+ regions are in a range of $0.5 \times 10^{20} - 5 \times 10^{20}$ cm-3.

Sum up, the embodiments of the disclosure adopt a heterogeneous junction structure for the plasma p-i-n diode, so that the carrier injection efficiency and the current are improved, and thus performance of the heterogeneous SiGe based plasma p-i-n diode is better than that of a homogenous plasma p-i-n diode. Moreover, the prepared plasma p-i-n diode applicable for a solid-state plasma reconfigurable antenna in the disclosure uses, an etching-based deep trench dielectric isolation process, which can effectively improve the breakdown voltage of the device and suppress the influence of the leakage current on the device performance. In addition, contradistinctively, in the conventional process of preparing a P region and an N region of a solid-state plasma p-i-n diode, an implantation process is adopted, such process requires relatively large implantation dosage and energy, has high requirements on equipment and is incompatible with the existing process. while if a diffusion process is adopted, a junction depth is deeper, but the P region and the N region have relatively larger areas, resulting in a low integration level and an uneven doping concentration, and thereby affecting electrical properties of the p-i-n diode and leading to poor controllability in concentration and distribution of the solid-state plasma.

Other aspects and features of the disclosure will become apparent from the following detailed description with reference to the attached drawings. It should be understood, however, that the drawings are designed solely for the purpose of illustration and not as a definition of the limits of the disclosure, for which reference should be made to the appended claims. It should also be understood that, unless otherwise indicated, it is not necessary to scale the drawings, and they simply try to conceptually explain the structures and processes described herein.

BRIEF DESCRIPTION OF THE DRAWINGS

Specific embodiments, of the disclosure are explained in detail with reference to accompanying drawings.

DETAILED DESCRIPTION OF PREFERRED EMBODIMENTS

In order to make the objectives, features and advantages of the disclosure more apparent and easy to understand, the specific embodiments of the disclosure are explained in detail in combination with accompanying drawings.

The disclosure provides a preparation method for a heterogeneous SiGe based plasma p-i-n diode string for a sleeve antenna. The heterogeneous SiGe based plasma p-i-n diode is a transverse p-i-n diode formed based on SiGe on an insulator substrate, and when a DC bias voltage is applied, a DC current will form solid-state plasma consisting of free carriers (electrons and holes) on the surface. The plasma has metal-like characteristics, that is, a reflection action for electromagnetic waves, and the reflection characteristic is closely related to microwave transmission characteristics, concentration and distribution of surface plasma.

A solid-state plasma p-i-n diode plasma reconfigurable antenna may be formed by arranging solid-state plasma p-i-n diodes in an array, and by selective conductions of the solid-state plasma p-i-n diodes in the array based on an external control, the array is caused to form dynamic stripes of the solid-state plasma, which has an antenna function and a function of emitting and receiving specific electromagnetic waves. Such antenna can change the stripe shape and distribution of the solid-state plasma by selective conductions of the solid-state plasma p-i-n diodes in the array, thereby realizing reconfiguration of the antenna, which has an important application prospect in aspects of national defense communication and radar technologies.

In the following, a preparation method for a heterogeneous SiGe based plasma p-i-n diode string for a sleeve antenna will be further described in detail. In the drawings, for the purpose of convenient explanation, thicknesses of layers and regions are zoomed in or out, and the shown sizes do not represent actual sizes.

Figure 1:
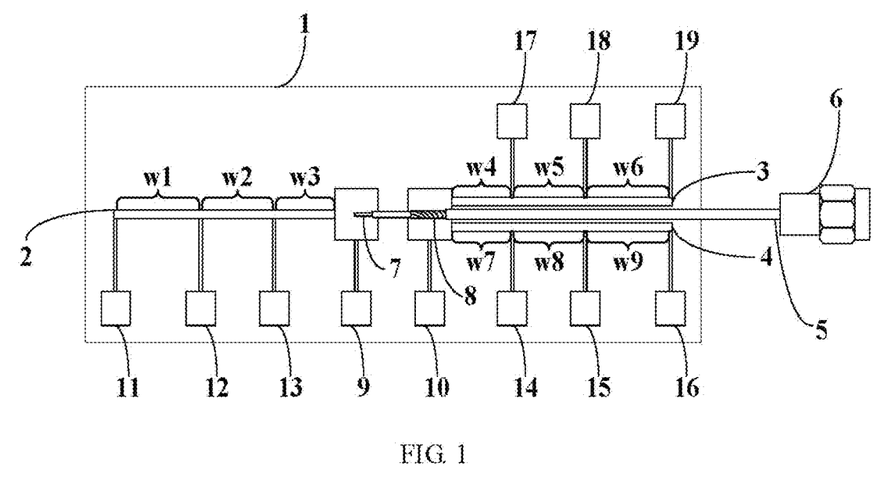
FIG. 1 is a structural schematic view of a reconfigurable sleeve antenna according to an embodiment of the disclosure.

Referring to FIG. 1, FIG. 1 is a structural schematic view of a reconfigurable sleeve antenna according to an embodiment of the disclosure. The plasma p-i-n diode string is used for manufacturing the sleeve antenna. As shown in FIG. 1, the sleeve antenna includes a semiconductor substrate 1, a p-i-n diode antenna arm 2, a first p-i-n diode sleeve 3, a second p-i-n diode sleeve 4, a coaxial feeder 5 and DC bias wires 9, 10, 11, 12, 13, 14, 15, 16, 17, 18, 19.

Figure 2:
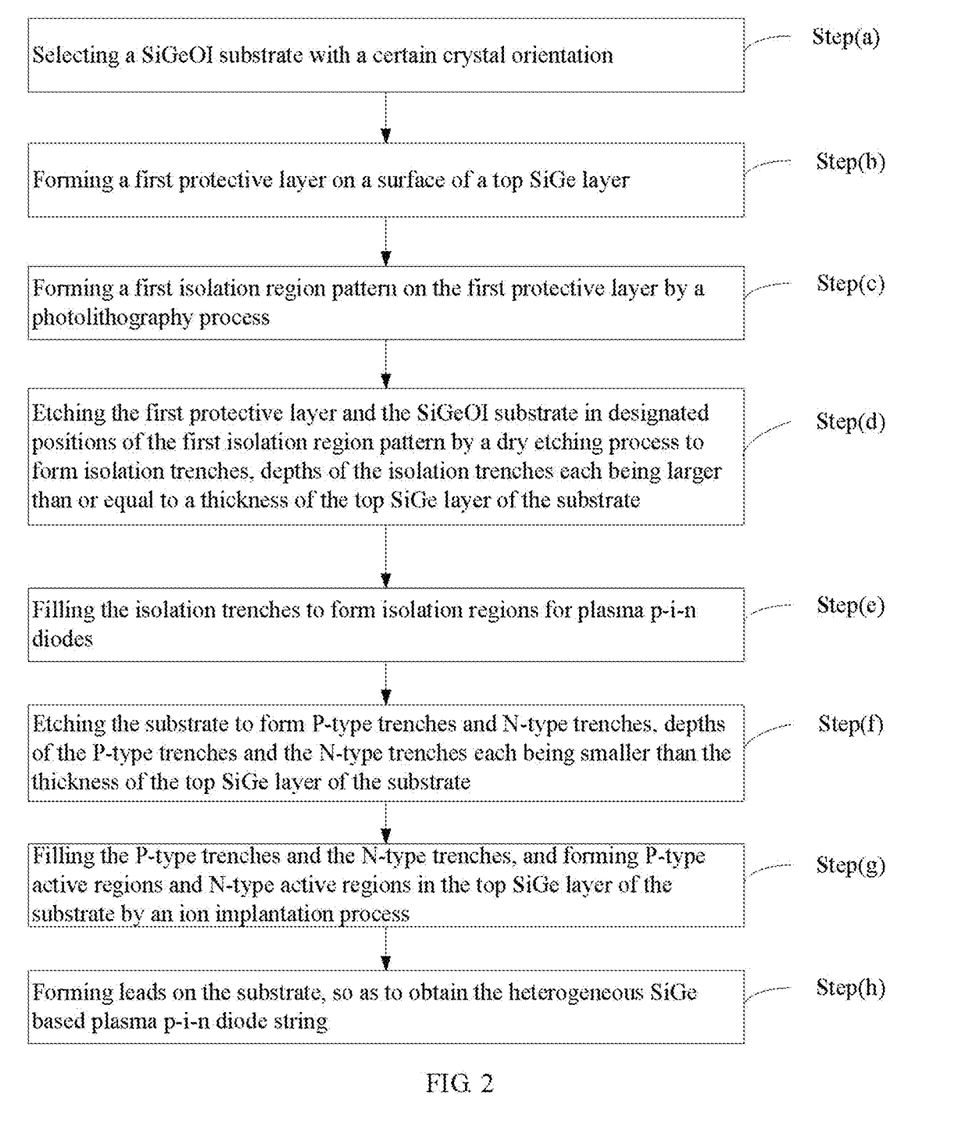
FIG. 2 is a flowchart of a preparation method for a heterogeneous SiGe based plasma p-i-n diode according to an embodiment of the disclosure.

Referring to FIG. 2, FIG. 2 is a flowchart of a preparation method for a heterogeneous SiGe based plasma p-i-n diode according to an embodiment of the disclosure and the preparation method includes the following steps of:

(a) selecting a SiGeOI substrate with a certain crystal orientation.

specifically, in the step (a), the cause of adopting the SiGeOI substrate is that a good microwave characteristic is required for the solid-state plasma antenna, while in order to meet this requirement, the p-i-n diode needs to possess good isolation characteristic and limiting capacity for carriers i.e., the solid-state plasma; and the SiGeOI substrate can conveniently form a p-i-n isolation region with isolation trenches, and $SiO_2$ can also limit the carriers i.e., the solid-state plasma in a top SiGe layer. Therefore, the SiGeOI is preferably adopted as a substrate of the solid-state plasma p-i-n diode. Besides, a carrier mobility of the SiGe material is large, thereby improving device performances.

(b) forming a first protective layer on a surface of the top SiGe layer;

(c) forming a first isolation region pattern on the first protective layer by a photolithography process;

(d) etching the first protective layer and the substrate in designated positions of the first isolation region pattern by a dry etching process to form isolation trenches, wherein depths of the isolation trenches each are larger than or equal to a thickness of the top SiGe layer of the substrate, i.e., a bottom surface of each of the isolation trenches is below the top SiGe layer (also referred to as the bottom surface of each isolation trench being lower than or at a same level with the bottom surface of the top SiGe layer), thereby ensuring subsequent connections between the $SiO_2$ in the trenches and oxide layers in the SiGeOI substrate and thereby forming complete insulating isolation;

(e) filling the isolation trenches to form isolation regions for plasma p-i-n diodes in the p-i-n diode string, wherein a material for filling the isolation trenches may be silicon dioxide ($SiO_2$);

(f) etching the substrate to form P-type trenches and N-type trenches, depths of the P-type trenches and the N-type trenches each being smaller than a thickness of the top SiGe layer of the substrate (also referred to as the P-type trenches and the N-type trenches each doing not penetrate through the top SiGe layer);

(g) filling the P-type trenches and the N-type trenches, and forming P-type active regions and N-type active regions in the top SiGe layer of the substrate by an ion implantation process; and (h) forming leads on the substrate to obtain the heterogeneous SiGe based plasma p-i-n diode string.

Further, based on the above embodiment, the first protective layer includes a first $SiO_2$ layer and a first SiN layer; and correspondingly the step (b) includes:

(b1) preparing a $SiO_2$ material on a surface of the SiGe layer to form the first $SiO_2$ layer; and (b2) preparing a SiN material on a surface of the first $SiO_2$ layer to form the first SiN layer.

The benefits of this step (b) lie in that: a stress of the SiN is isolated by using a looseness characteristic of the $SiO_2$, such that the stress cannot be conducted into the top SiGe layer, thereby ensuring performance stability of the top SiGe layer; and based on a high selection ratio of the SiN to SiGe during dry etching, and by using the SiN as a mask of the dry etching, the process is easy to implement. Of course, it is understandable that a layer number of the protective layer and a material of the protective layer are not limited here as long as the protective layer can be formed.

Further, based on the above embodiment(s), the step (f) includes:

(f1) forming a second protective layer on a surface of the substrate;

(f2) forming a second isolation region pattern on the second protective layer by a photolithography process; and (f3) etching the second protective layer and the substrate in designated positions of the second isolation region pattern by a dry etching process to form the P-type trenches and the N-type trenches.

Specifically, depths of the P-type trenches and the N-type trenches each are larger than a thickness of the second protective layer but smaller than a sum of the thicknesses of the second protective layer and a thickness of the top SiGe layer of the substrate. Preferably, a distance between each of bottoms of the P-type trenches and the N-type trenches and the bottom of the top SiGe layer of the substrate is 0.5 micrometers to 30 micrometers, and a generally recognized deep trench is formed. In this way, high-doping concentration P and N regions with uniformly distributed impurities and steep Pi and Ni junctions may be fainted when the P-type and N-type active regions are formed, which is favorable to improve a plasma concentration of the i regions (intrinsic region).

Further, based on the above embodiment(s), the second protective layer includes a second $SiO_2$ layer and a second SiN layer; and correspondingly the step (f1) includes:

(f11) preparing a $SiO_2$ material on the surface of the substrate to form the second $SiO_2$ layer; and (f12) preparing a SiN material on a surface of the second $SiO_2$ layer to form the second SiN layer.

The benefits of this step (f1) are similar to that of the first protective layer and are not repeated herein.

Further, based on the above embodiment(s), the step (g) includes:

(g1) oxidizing the P-type trenches and the N-type trenches to form oxide layers on inner walls of the P-type trenches and the N-type trenches;

(g2) etching the oxide layers on the inner walls of the P-type trenches and the N-type trenches by a wet etching process to planarize the inner walls of the P-type trenches and the N-type trenches, wherein the benefits of this step (g) are to prevent protrusions on the side walls of the trenches from forming an electric field concentrated region and from causing breakdown of the P-i and N-i junctions; and (g3) filling the P-type trenches and the N-type trenches.

Based on the above embodiment(s), the step (g3) includes:

(g31) filling the P-type trenches and the N-type trenches with a polysilicon, wherein since the I region is SiGe, and has high carrier mobility and narrower energy gap, the polysilicon is filled into the P and N regions to form heterojunction structures, and the energy gap of the silicon material is larger than that of SiGe, thereby generating a high injection ratio and improving device performances;

(g32) forming a polysilicon layer on the substrate after planarizing the substrate;

(g33) patterning the polysilicon layer by photolithography, implanting a P-type impurity and an N-type impurity respectively in positions where the P-type trenches and the N-type trenches are located by an ion implantation process with a photoresist to form P-type contact regions and N-type contact regions while forming the P-type active regions and the N-type active regions;

(g34) removing the photoresist; and (g35) removing the polysilicon layer outside the P-type contact regions and the N-type contact regions by wet etching.

Further, based on the above embodiment(s), the step (h) includes:

(h1) preparing a $SiO_2$ material on the substrate;

(h2) activating the impurities in the active regions by an annealing process;

(h3) forming lead holes by photolithography in the P-type contact regions and the N-type contact regions to form the leads; and (h4) performing a passivation treatment, forming pads by photolithography and performing an interconnection, so as to obtain the heterogeneous SiGe based plasma p-i-n diode string.

Further, based on the above embodiment(s), referring to FIG. 1 again, the p-i-n diode antenna arm 2 the first p-i-n diode sleeve 3, the second p-i-n diode sleeve 4 and the direct bias wires 9, 10, 11, 12, 13, 14, 15, 16, 17, 18, 19 are all manufactured on the semiconductor substrate 1. The p-i-n diode antenna arm 2, the first p-i-n diode sleeve 3 and the second p-i-n diode sleeve 4 are connected by the coaxial feeder 5. An inner core wire 7 of the coaxial feeder 5 is connected to the p-i-n diode antenna arm 2 and, an outer conductor 8 of the coaxial feeder 5 is connected to the first p-i-n diode sleeve 3 and the second p-i-n diode sleeve 4.

The p-i-n diode antenna arm 2 includes p-i-n diode strings w1, w2, w3 serially connected in sequence. The first p-i-n diode sleeve 3 includes p-i-n diode strings w4, w5, w6 serially connected in sequence. The second p-i-n diode sleeve 4 includes p-i-n diode strings w7, w8, w9 serially connected in sequence. All the p-i-n diode strings w1, w2, w3, w4, w5, w6, w7, w8, w9 are connected to DC biases by the corresponding DC bias wires 9, 10, 11, 12, 13, 14, 15, 16, 17, 18, 19.

Figure 3:
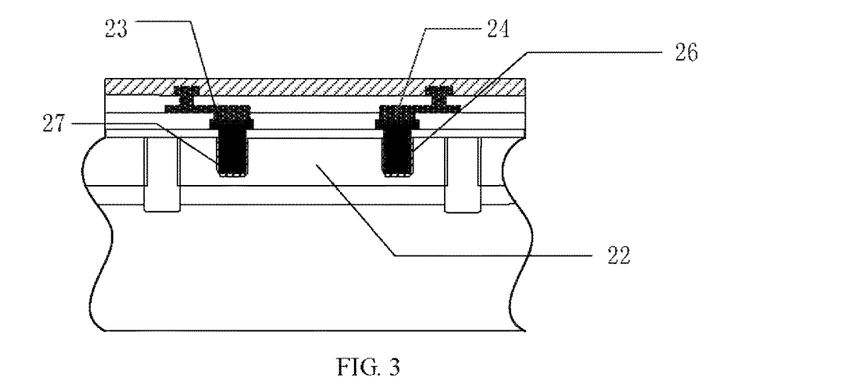
FIG. 3 is a structural schematic view of a heterogeneous SiGe based plasma p-i-n diode provided by an embodiment of the disclosure.
Figure 4:
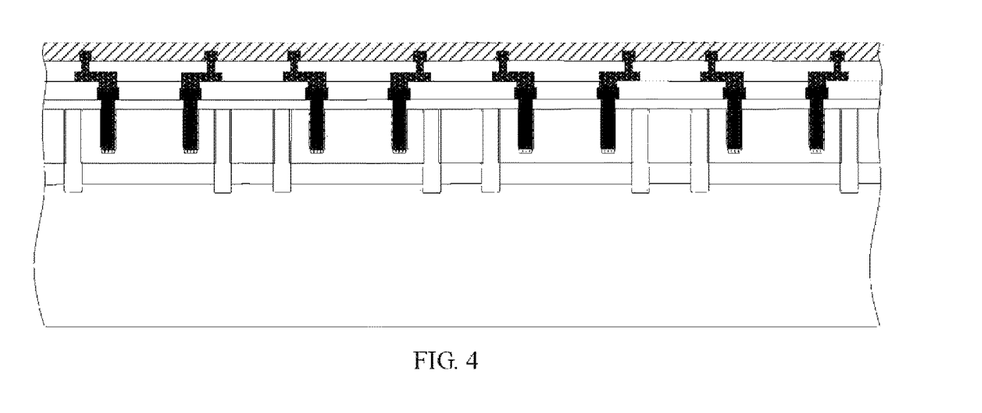
FIG. 4 is a structural schematic view of a heterogeneous SiGe based plasma p-i-n diode string provided by an embodiment of the disclosure.

Further, based on the above embodiment(s), referring to FIGS. 3 and 4, FIG. 3 is a structural schematic view of a heterogeneous SiGe based plasma p-i-n diode provided by an embodiment of the disclosure and FIG. 4 is a structural schematic view of a heterogeneous SiGe based plasma p-i-n diode string provided by an embodiment of the disclosure. Each of the p-i-n diode strings w1, w2, w3, w4, w5, w6, w7, w8 and w9 includes p-i-n diodes, and each of the p-i-n diodes includes a P+ region 27, an N+ region 26, an intrinsic region 22, a P+ contact region 23 and an N+ contact region 24. The P+ contact regions 23 are connected to the P+ regions 27 and a positive electrode of a DC power supply. The N+ contact regions 24 are connected to the N+ regions 26 and a negative electrode of the DC power supply.

Further, based on the above embodiment(s), doping concentrations of the P+ regions and the N+ regions are in a range of $0.5 \times 10^{20}$–$5 \times 10^{20}$ cm$^{-3}$.

The preparation method for a heterogeneous SiGe based plasma p-i-n diode string in the disclosure has the following advantages:

(1) due to the characteristics of high mobility and long carrier service life of the SiGe material used by the p-i-n diode, a solid-state plasma concentration of the p-i-n diode can be effectively improved;

(2) the p-i-n diode adopts the heterojunction structures, the i region is SiGe and has high carrier mobility and narrower energy gap, the polysilicon is filled into the P and N regions so as to form the heterojunction structures, and the energy gap of the silicon material is larger than that of SiGe, thereby generating a high injection ratio and improving device performances; and (3) The p-i-n diode adopts an etching-based deep trench dielectric isolation process, thereby effectively improving a breakdown voltage of the device and inhibiting influences of a leakage current on the device performances.

Figure 5A:
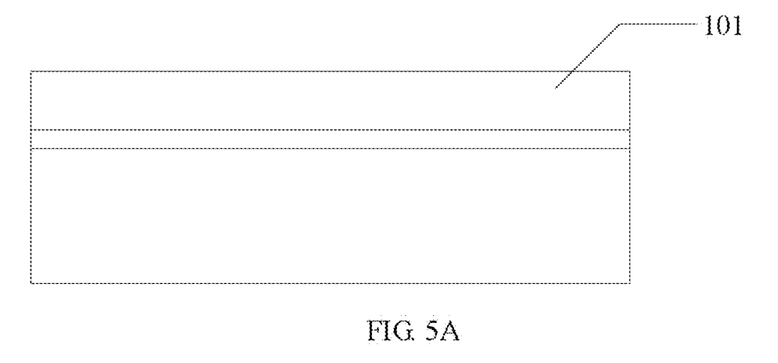
FIGS. 5A to 5R are schematic views of another preparation method for a heterogeneous SiGe based plasma p-i-n diode according to an embodiment of the disclosure.
Figure 5B:
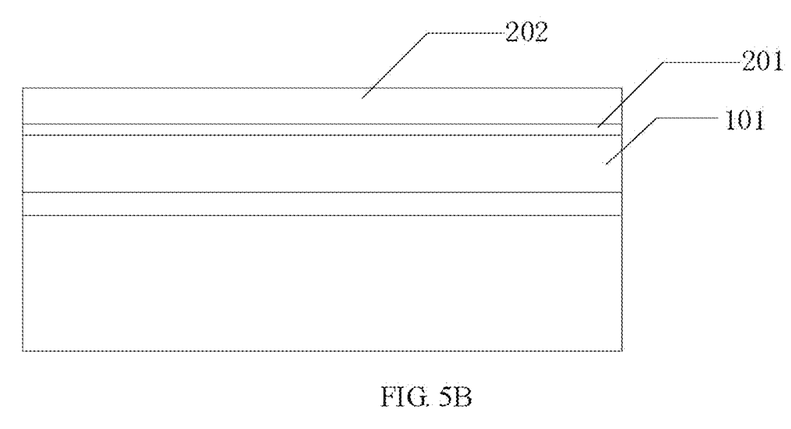
Figure 5C:
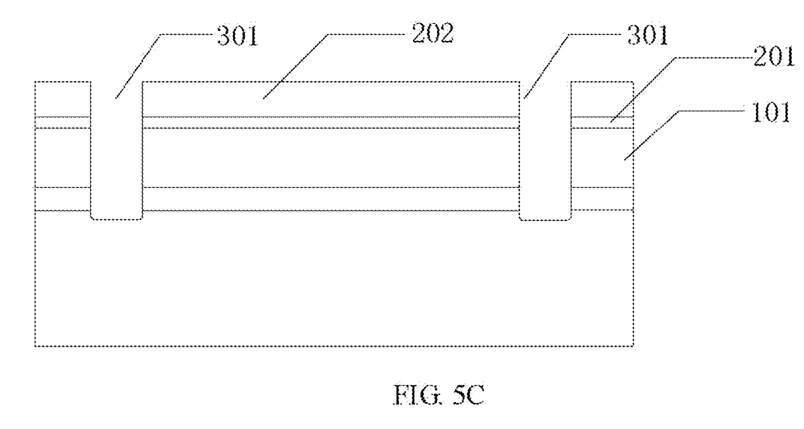
Figure 5D:
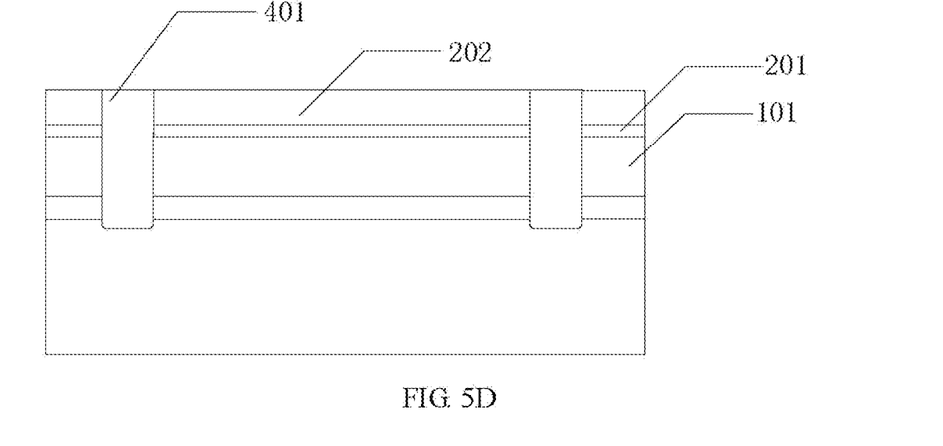
Figure 5E:
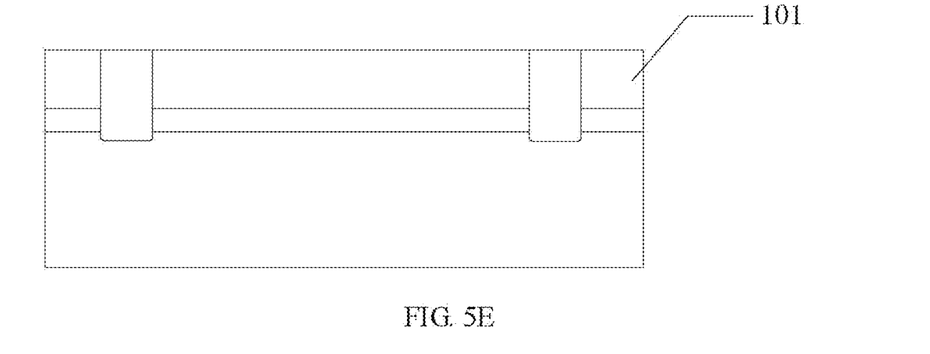
Figure 5F:
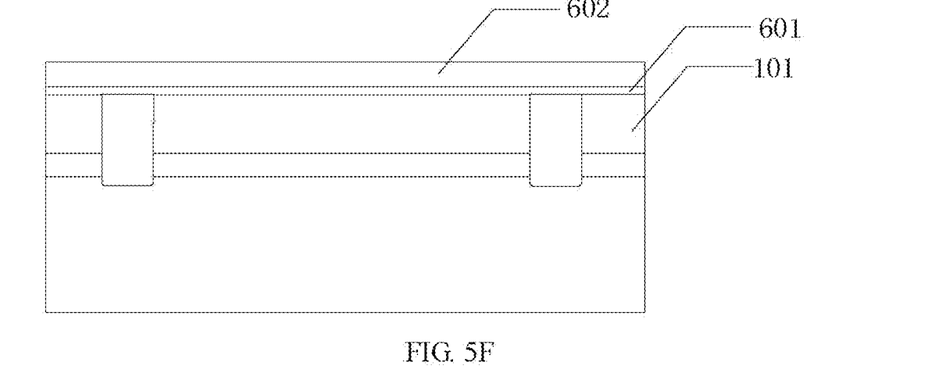
Figure 5G:
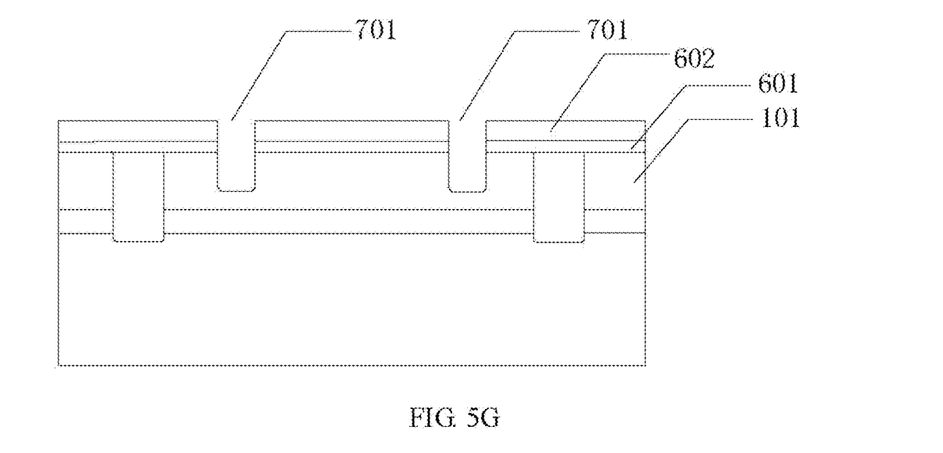
Figure 5H:
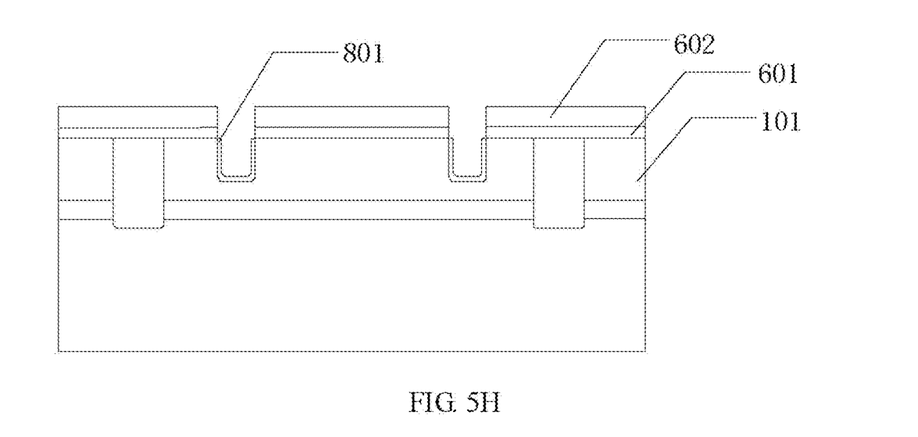
Figure 5I:
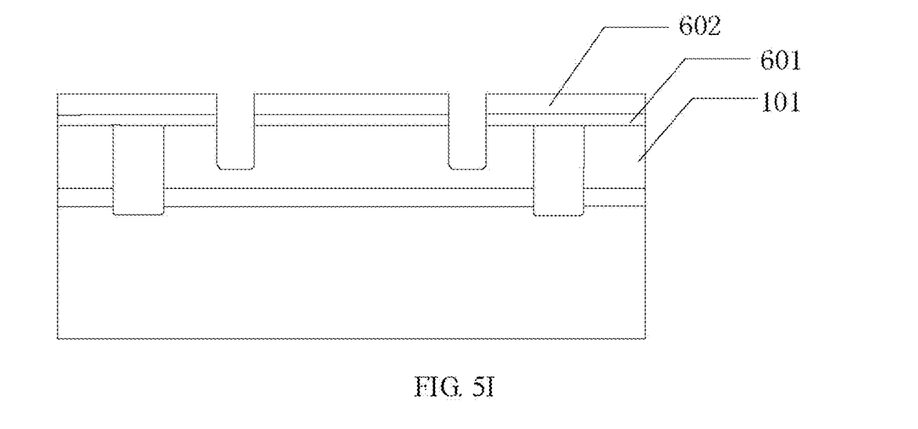
Figure 5J:
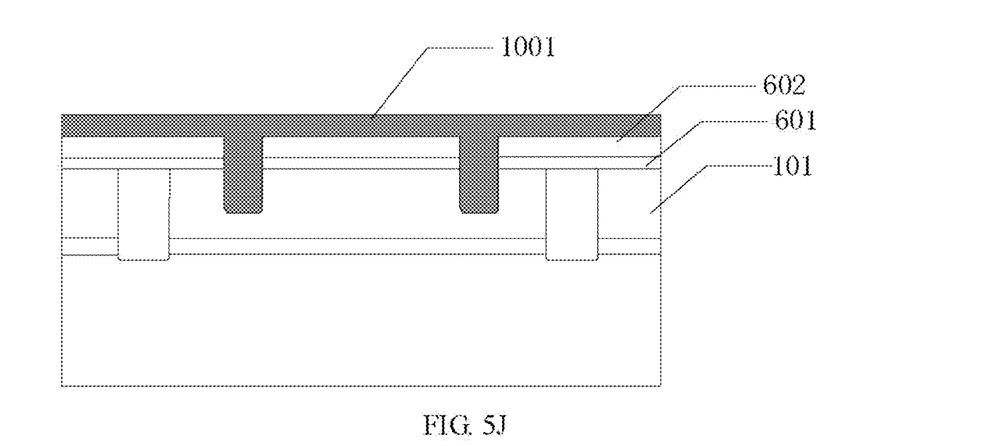
Figure 5K:
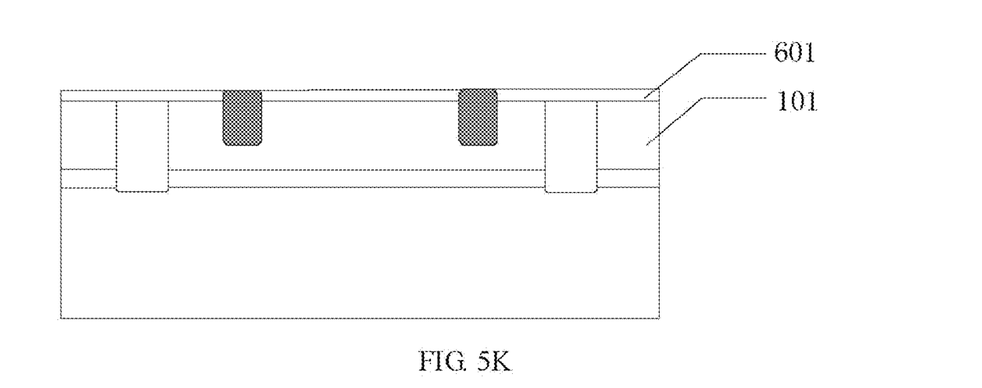
Figure 5L:
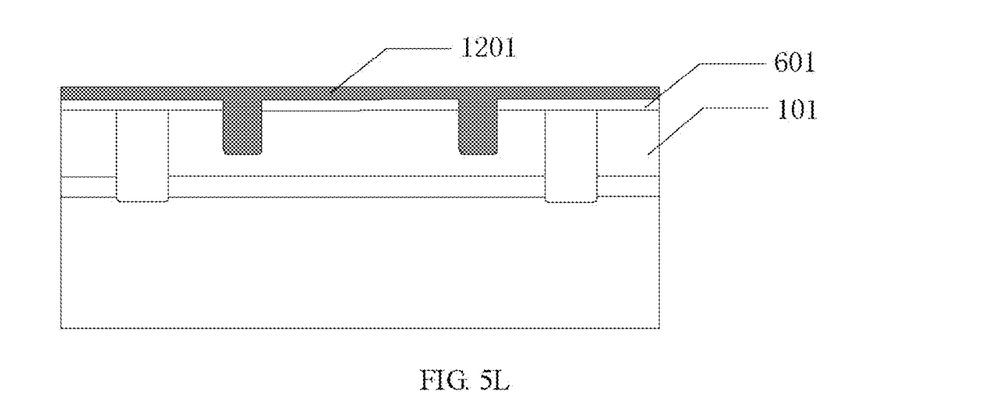
Figure 5M:
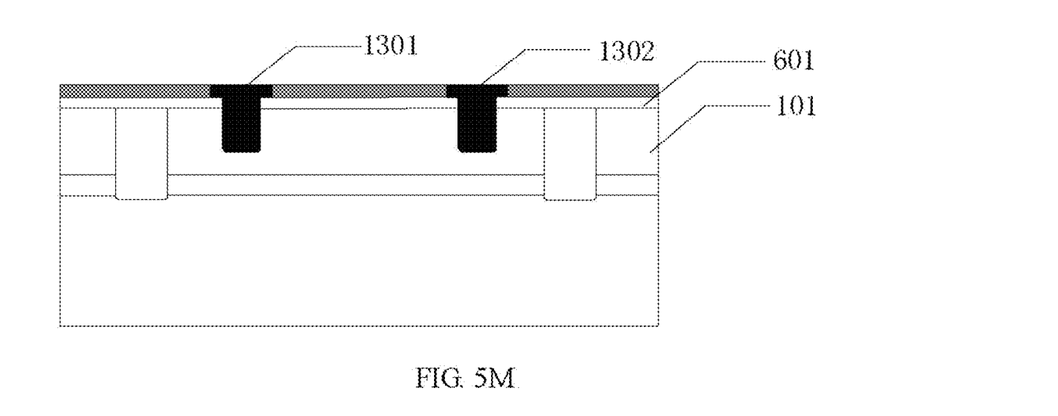
Figure 5N:
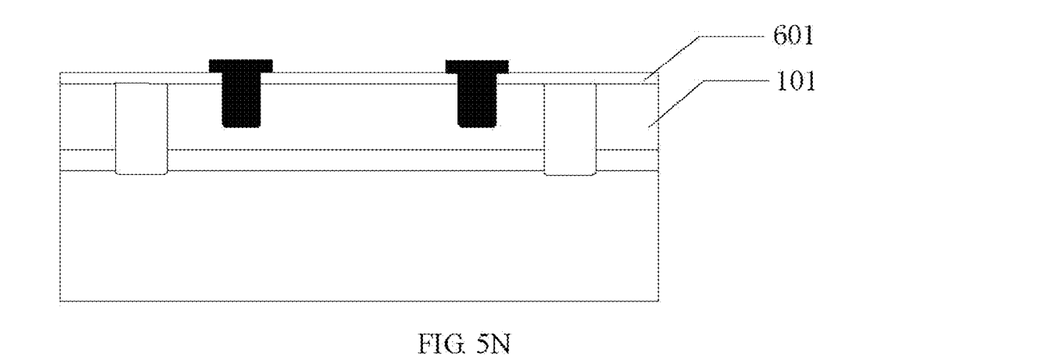
Figure 5O:
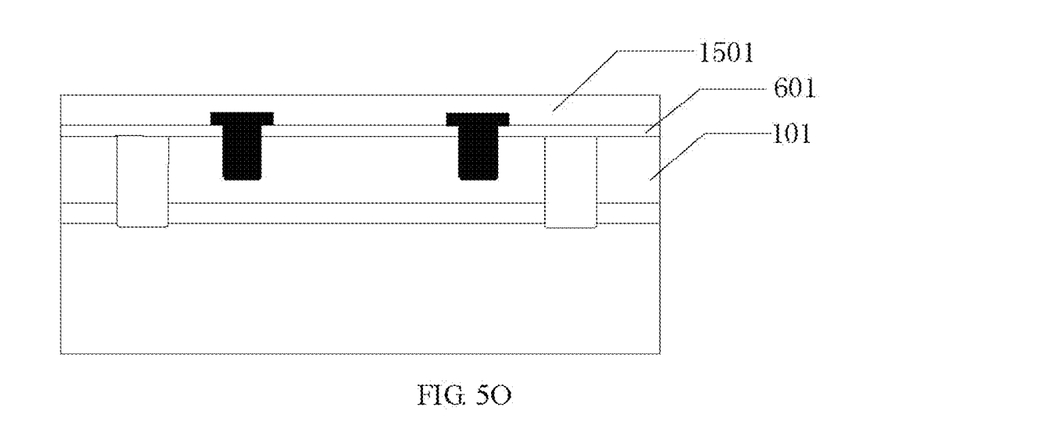
Figure 5P:
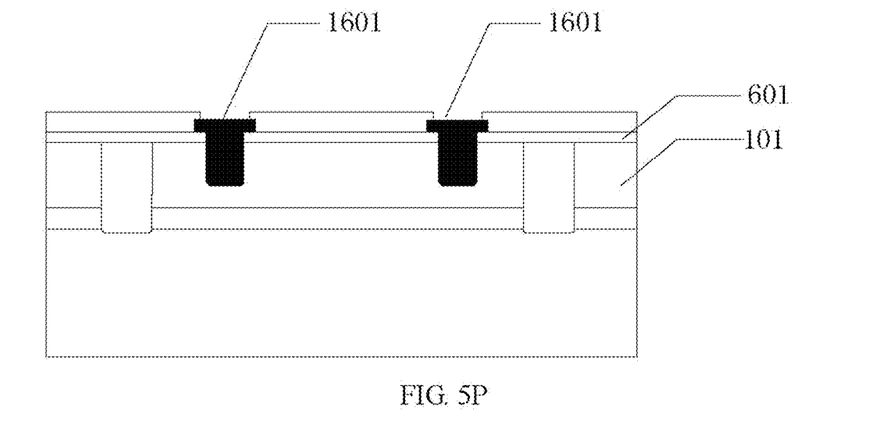
Figure 5Q:
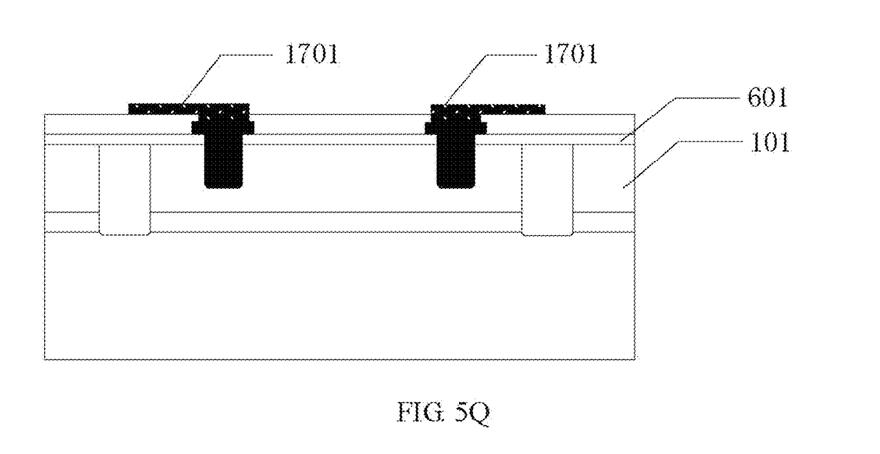
Figure 5R:
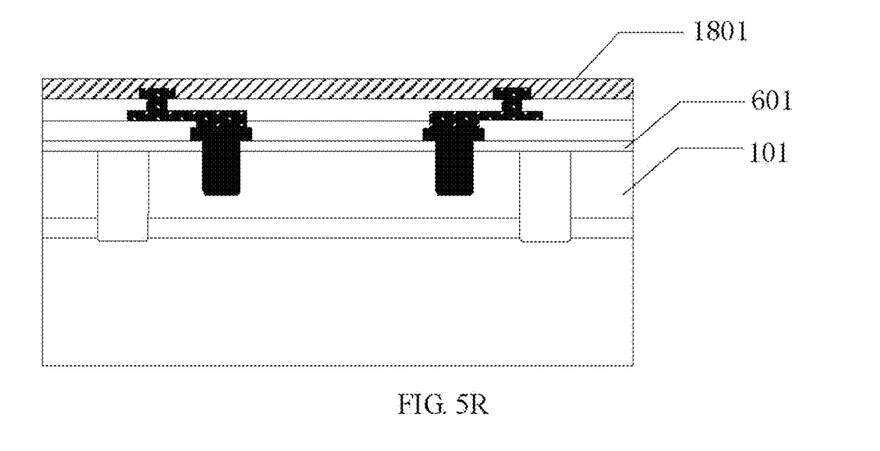

Referring to FIGS. 5A to 5R, FIGS. 5A to 5R are schematic views of another preparation method a heterogeneous SiGe based plasma p-i-n diode string according to an embodiment of the disclosure. Based on the above embodiment(s), the preparation of a solid-state plasma p-i-n diode with a channel length of 22 nm (a length of a solid-state plasma region is 100 micrometers) is taken as an example for explanation in detail. The specific steps are as follows.

Step 1 is a step of preparing, a substrate material and includes:

(1a) as shown in FIG. 5A, selecting a SiGeOI substrate with a (100) crystal orientation, a doping type of P-type and a doping concentration of $10^{14}$ cm$^{-3}$, a thickness of the top SiGe layer being 50 μm;

(1b) as shown in FIG. 5B, adopting a chemical vapor deposition (CVD) process to deposit a first SiO2 layer with a thickness of 40 nm on the SiGe layer; and (1c) adopting a CVD process to deposit a first $Si_3N_4$/SiN layer 202 with a thickness of 2 μm on the substrate.

Step 2 is an isolation preparing step and includes:

(2a) as shown in FIG. 5C forming an isolation region on the above protective layer by a photolithography process, wet-etching the first $Si_3N_4$/SiN layer 202 of the isolation region to form an isolation region pattern; and forming deep isolation trenches 301 with a width of 5 μm and a depth of 50 μm in the isolation region by dry etching;

(2b) as shown in FIG. 5D, depositing a $SiO_2$ 401 to fully fill the deep isolation trenches by a CND process; and (2c) as shown in FIG. 5E, removing the first $Si_3N_4$/SN layer 202 and the first $SiO_2$ layer on the surface by a chemical mechanical polishing (CMP) process, to planarize the surface of the substrate.

Step 3 is a step of preparing trenches of P and N regions and includes:

(3a) as shown in FIG. 5F, continuously depositing two layers of materials on the substrate by a CVD process, the first layer being a second $SiO_2$ layer 601 with a thickness of 300 nm and the second layer being a second $Si_3N_4$/SiN layer 602 with a thickness of 500 nm;

(3b) as shown in FIG. 5G, forming the deep trenches of the P and N regions by photolithographs wet-etching the second $Si_3N_4$/SiN layer 602 and the second $SiO_2$ layer 601 of the P and N regions to form patterns of the P and N regions; and forming trenches 701 with a width of 4 μm and a depth of 5 μm in the P and N regions by dry etching, lengths of the trenches in the P and N regions being determined according to an application condition of a prepared antenna;

(3c) as shown in FIG. 5H, at 850 degrees Celsius, performing a high temperature treatment for 10 minutes, and oxidizing, inner walls of the trenches to form oxide layers 801, to make the inner walls of the trenches of the P and N regions to be smooth; and (3d) as shown in FIG. 5I, removing the oxide layers 801 on the inner walls of the trenches of the P and N regions by a wet etching process.

Step 4 is a step of preparing P and N contact regions and includes:

(4a) as shown in FIG. 5J, depositing a polysilicon 1001 in the trenches of the P and N regions by a CCD process and fully filling the trenches;

(4b) as shown in FIG. 5K, removing the polysilicon 1001 and the second $Si_3N_4$/SiN layer 602 on the surface by CMP to make the surface to be smooth;

(4c) as shown in FIG. 5L, depositing a layer of polysilicon 1201 with a thickness of 200-500 nm on the surface by a CVD process;

(4d) as shown in FIG. 5M, forming a P region active region by photolithography, performing P+ implantation by an ion implantation process with a photoresist to make a doping concentration of the P region active region up to $0.5 \times 10^{20}$ $cm^{-3}$, and removing the photoresist to form a P contact 1301;

(4e) forming an N region active region by photolithography, performing N+ injection by an ion implantation process with a photoresist to make a doping concentration of the N region active region up to $0.5 \times 10^{20}$ $cm^{-3}$, and removing, the photoresist to form an N contact 1302;

(4f) as shown in FIG. 5N, wet-etching the poly silicon 1201 outside the P and N contact regions to form the P and N contact regions;

(4g) as shown in FIG. 5O, using a CVD method to deposit a $SiO_2$ 1501 with a thickness of 800 nm on the surface; and (4h) at 1000 degrees Celsius, annealing for 1 minute to activate ion implanted impurities and propel the impurities in the poly silicon.

Step 5 is a step of forming the P-I-N diode and includes:

(5a) as shown in FIG. 5P, forming lead holes 1601 in the P and N contact regions by photolithography;

(5b) as shown in FIG. 5Q, sputtering a metal on the surface of the substrate, alloying to form a metal silicide 1701 at 750 degrees Celsius, and etching the metal on the surface;

(5c) sputtering a metal on the surface of the substrate and forming the leads by photolithography; and (5d) as shown in FIG. 5R, depositing a $Si_3N_4$/SiN to form a passivation layer 1801 and forming pads by photolithography, so as to form the P-I-N diode as a material for preparing a solid-state plasma antenna.

In the illustrated embodiment, the above various process parameters are all examples, and transformations made according to conventional means of those skilled in the art are all in a protection scope of the disclosure.

According to the p-i-n diode applied to the solid-state plasma reconfigurable antenna and prepared by the disclosure, firstly, due to the characteristics of high mobility and long carrier service life of the used SiGe material, a solid-state plasma concentration of the p-i-n diode is improved. In addition, the P region and the N region of the heterogeneous SiGe based p-i-n diode adopt a deep trench etching-based polysilicon embedding process, the process can provide abrupt p-i and n-i junctions, and can effectively improve junction depths of the p-i and n-i junctions, such that controllability in concentration and distribution of the solid-state plasma is enhanced, which is favorable to prepare the plasma antenna of high performances. Besides, the p-i-n diode applied to the solid-state plasma reconfigurable antenna prepared by the disclosure adopts an etching-based deep trench dielectric isolation process, thereby effectively improving a breakdown voltage of the devices and inhibiting influences of a leakage current on the device performances.

Figure 6:
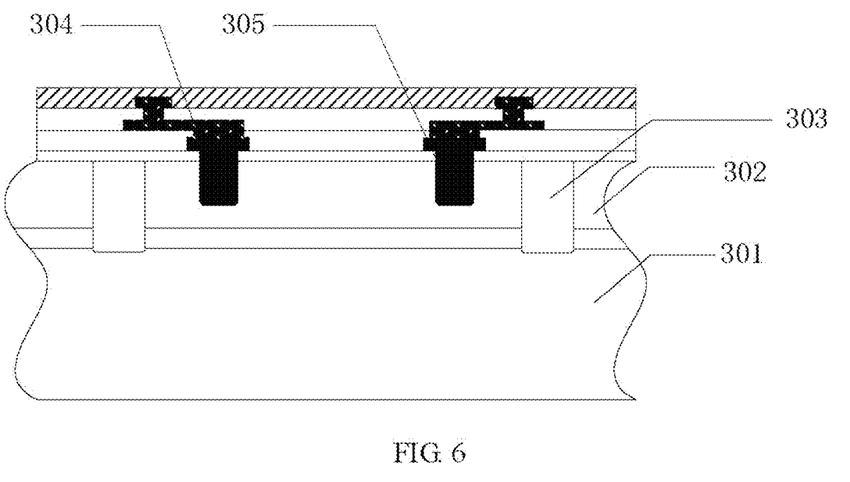
FIG. 6 is a structural schematic view of another heterogeneous SiGe based plasma p-i-n diode according to an embodiment of the disclosure.

Referring to FIG. 6, FIG. 6 is a structural schematic view of another heterogeneous SiGe based plasma p-i-n diode according to an embodiment of the disclosure. The SiGe based plasma p-i-n diode is prepared by the preparation method as shown in FIG. 2. Specifically, the SiGe based plasma p-i-n diode is prepared on a SiGeOI substrate 301, and a P region 304 and an N region 305 of the p-i-n diode and an I region transversely located between the P region 304 and the N region 305 are all located in a top SiGe layer 302 of the substrate. The p-i-n diode may adopt a STI deep trench isolation, that is, one isolation trench 303 is disposed on an outer side of each of the P region 304 and the N region 305, and depths of the isolation trenches 303 are larger than or equal to a thickness of the top SiGe layer, i.e., the isolation trenches 303 each penetrate through the top SiGe layer.

In summary, specific examples are used herein to describe the principle and implementation manners of the solid-state plasma p-i-n diode and its preparation method of the disclosure, and the description of the foregoing embodiments is merely used to help understand the method and core idea of the disclosure. At the same time, for those skilled in the art, according to the idea of the disclosure, some changes may be made in the specific implementations and application ranges. Sum up, the content of the present specification should not be construed as a limitation of disclosure. The protection scope of the disclosure should be covered by the appended claims.

INDUSTRIAL PRACTICABILITY

The embodiments of the disclosure adopt a heterogeneous junction structure for the plasma p-i-n diode, so that the carrier injection efficiency and the current are improved, and thus performance of the heterogeneous SiGe based plasma p-i-n diode is better than that of a homogenous plasma p-i-n diode. Moreover, the prepared plasma p-i-n diode applicable for a solid-state plasma reconfigurable antenna in the disclosure uses an etching-based deep trench dielectric isolation process, which can effectively improve the breakdown voltage of the device and suppress the influence of the leakage current on the device performance. In addition, contradistinctively, in the conventional process of preparing a P region and an N region of a solid-state plasma p-i-n diode, an implantation process is adopted, such process requires relatively large implantation dosage and energy, has high requirements on equipment and is incompatible with the existing process. while if a diffusion process is adopted, a junction depth is deeper, but the P region and the N region have relatively larger areas, resulting in a low integration level and an uneven doping concentration, and thereby affecting electrical properties of the p-i-n diode and leading to poor controllability in concentration and distribution of the solid-state plasma.

What is claimed is:

1. A preparation method for a heterogeneous SiGe based plasma p-i-n diode string for a sleeve antenna, wherein the plasma p-i-n diode string is configured for manufacturing the sleeve antenna, the sleeve antenna comprises a semiconductor substrate, a p-i-n diode antenna arm, a first p-i-n diode sleeve, a second p-i-n diode sleeve, a coaxial feeder and direct current (DC) bias wires; the preparation method comprises steps of:

(a) selecting a silicon-germanium-on-insulator (SiGeOI) substrate with a certain crystal orientation;

(b) forming a first protective layer on a surface of a top SiGe layer of the SiGeOI substrate;

(c) forming a first isolation region pattern on the first protective layer by a photolithography process;

(d) etching the first protective layer and the SiGeOI substrate in designated positions of the first isolation region pattern by a dry etching process to form isolation trenches, wherein depths of the isolation trenches each are larger than or equal to a thickness of the top SiGe layer of the SiGeOI substrate;

(e) filling the isolation trenches to form an isolation region of the plasma p-i-n diode;

(f) etching the SiGeOI substrate to form a P-type trench and an N-type trench, wherein depths of the P-type trench and the N-type trench each are smaller than the thickness of the top SiGe layer of the SiGeOI substrate;

(g) filling the P-type trench and the N-type trench, and forming a P-type active region and an N-type active region in the top SiGe layer of the SiGeOI substrate by an ion implantation process; and (h) forming leads on the SiGeOI substrate, so as to obtain the heterogeneous SiGe based plasma p-i-n diode string.

2. The preparation method according to claim 1, wherein the first protective layer comprises a first silicon oxide ($SiO_2$) layer and a first silicon nitride (SiN) layer; and correspondingly the step (b) comprises:

(b1) preparing a $SiO_2$ on a surface of the top SiGe layer to form the first $SiO_2$ layer; and (b2) preparing a SiN on a surface of the first $SiO_2$ layer to form the first SiN layer.

3. The preparation method according to claim 1 wherein the step (f) comprises:

(f1) forming a second protective layer on a surface of the SiGeOI substrate;

(f2) forming a second isolation region pattern on the second protective layer by a photolithography process; and (f3) etching the second protective layer and the SiGeOI substrate in designated positions of the second isolation region pattern by a dry etching process to form the P-type trench and the N-type trench.

4. The preparation method according to claim 3, wherein the second protective layer comprises a second $SiO_2$ layer and a second SiN layer; and correspondingly the step (f1) comprises:

(f11) preparing a $SiO_2$ on the surface of the SiGeOI substrate to form the second $SiO_2$ layer; and (f12) preparing a SiN on a surface of the second $SiO_2$ layer to form the second SiN layer.

5. The preparation method according to claim 1, wherein the step (g) comprises:

(g1) oxidizing the P-type trench and the N-type trench to form oxide layers on inner walls of the P-type trench and the N-type trench;

(g2) etching the oxide layers on the inner walls of the P-type trench and the N-type trench by a wet etching process to planarize the inner walls of the P-type trench and the N-type trench; and (g3) filling the P-type trench and the N-type trench.

6. The preparation method according to claim 5, wherein the step (g3) comprises:

(g31) filling the P-type trench and the N-type trench with a polysilicon;

(g32) forming a polysilicon layer on the SiGeOI substrate after planarizing the SiGeOI substrate;

(g33) patterning the polysilicon layer by photolithography, implanting a P-type impurity and an N-type impurity respectively in positions where the P-type trench and the N-type trench are located by an ion implantation process with a photoresist to form the P-type active region and the N-type active region and meanwhile form a P-type contact region and an N-type contact region;

(g34) removing the photoresist; and (g35) removing the polysilicon layer outside the P-type contact region and the N-type contact region by a wet etching.

7. The preparation method according to claim 1, wherein the step (h) comprises:

(h1) preparing a $SiO_2$ on the SiGeOI substrate;

(h2) activating impurities in the active regions by an annealing process;

(h3) forming lead holes by photolithography in the P-type contact region and the N-type contact region to form the leads;

(h4) performing a passivation treatment, forming pads by photolithography and performing an interconnection, so as to obtain the heterogeneous SiGe based plasma p-i-n diode string.

8. The preparation method according to claim 1, wherein the p-i-n diode antenna arm, the first p-i-n diode sleeve, the second p-i-n diode sleeve and the DC bias wires are all formed on the semiconductor substrate; the p-i-n diode antenna arm, the first p-i-n diode sleeve and the second p-i-n diode sleeve are connected by the coaxial feeder, an inner core wire of the coaxial feeder is connected to the p-i-n diode antenna arm, and an outer conductor of the coaxial feeder is connected to the first p-i-n diode sleeve and the second p-i-n diode sleeve;

wherein the p-i-n diode antenna arm comprises serially connected p-i-n diode strings, the first p-i-n diode sleeve comprises serially connected p-i-n diode strings, the second p-i-n diode sleeve comprises serially connected p-i-n diode strings, and each the p-i-n diode string is connected to a DC bias through a corresponding one of the DC bias wires.

9. The preparation method according to claim 1, wherein the plasma p-i-n diode string comprises p-i-n diodes, each of the p-i-n diodes comprises a P+ region, an N+ region, an intrinsic region, a P+ contact region and an N+ contact region; the P+ contact regions are connected to the P+ regions and an positive electrode of a DC power supply, and the N+ contact regions are connected to the N+ regions and a negative electrode of the DC power supply.

10. The preparation method according to claim 9, wherein doping concentrations of the P+ regions and the N+ regions are in a range of $0.5 \times 10^{20}$–$5 \times 10^{20}$ $cm^{-3}$.

* * * * *